United States Patent
Iguchi et al.

(10) Patent No.: US 10,367,037 B2
(45) Date of Patent: Jul. 30, 2019

(54) PIXEL STRUCTURE OF OLED DISPLAY PANEL AND MANUFACTURING METHOD THEREOF

(71) Applicant: Shenzhen China Star Optoelectronics Semiconductor Display Technology Co., Ltd., Shenzhen (CN)

(72) Inventors: Shinsuke Iguchi, Shenzhen (CN); Yuan-Chun Wu, Shenzhen (CN); Yuying Cai, Shenzhen (CN)

(73) Assignee: Shenzhen China Star Optoelectronics Semiconductor Display Technology Co., Ltd., Shenzhen (CN)

( * ) Notice: Subject to any disclaimer, the term of this patent is extended or adjusted under 35 U.S.C. 154(b) by 0 days.

(21) Appl. No.: 15/572,508

(22) PCT Filed: Jun. 22, 2017

(86) PCT No.: PCT/CN2017/089611
§ 371 (c)(1),
(2) Date: Nov. 8, 2017

(87) PCT Pub. No.: WO2018/196144
PCT Pub. Date: Nov. 1, 2018

(65) Prior Publication Data
US 2018/0315800 A1    Nov. 1, 2018

(30) Foreign Application Priority Data

Apr. 28, 2017  (CN) .......................... 2017 1 0298982

(51) Int. Cl.
*H01L 51/52*    (2006.01)
*H01L 27/32*    (2006.01)
(Continued)

(52) U.S. Cl.
CPC .......... *H01L 27/3218* (2013.01); *H01L 27/32* (2013.01); *H01L 27/3246* (2013.01);
(Continued)

(58) Field of Classification Search
None
See application file for complete search history.

(56) References Cited

U.S. PATENT DOCUMENTS

2009/0309108 A1   12/2009  Chang et al.
2015/0144893 A1    5/2015  Chen
(Continued)

FOREIGN PATENT DOCUMENTS

CN    101604703 A    12/2009
CN    103280162 A     9/2013
(Continued)

*Primary Examiner* — Cheung Lee
(74) *Attorney, Agent, or Firm* — Mark M. Friedman

(57) ABSTRACT

A pixel structure of an organic light emitting diode (OLED) display panel and a manufacturing method thereof are disclosed. The pixel structure comprises a pixel region, anode conductive layers, pixel units, and a cathode conductive layer. The pixel region comprises sub-pixel regions arranged in sequence, at least two adjacent sub-pixel regions defined as a sub-pixel region group are disposed integrally. The anode conductive layers are disposed in the sub-pixel regions respectively, and separated from each other. The cathode conductive layer is electrically connected with the anode conductive layers to control the pixel units. Each of the pixel units comprises sub-pixels and is disposed in the pixel region. Each of the sub-pixels is disposed in one of the sub-pixel regions. The sub-pixels are formed integrally and have a same color in the sub-pixel region group. The pixel unit comprises a hole injection layer, a luminous layer and an electron injection layer.

13 Claims, 6 Drawing Sheets

(51) Int. Cl.
*H01L 51/56* (2006.01)
*H01L 51/50* (2006.01)

(52) U.S. Cl.
CPC ...... *H01L 51/5088* (2013.01); *H01L 51/5092* (2013.01); *H01L 51/52* (2013.01); *H01L 51/56* (2013.01)

(56) References Cited

U.S. PATENT DOCUMENTS

| | | |
|---|---|---|
| 2016/0126298 A1 | 5/2016 | Chen |
| 2016/0126499 A1* | 5/2016 | Dai ............... H01L 27/3211 257/40 |
| 2016/0148981 A1* | 5/2016 | Matsueda ........ H01L 27/3218 257/40 |
| 2017/0294155 A1* | 10/2017 | Kim ............... H01L 27/3248 |
| 2018/0182826 A1 | 6/2018 | Chen et al. |
| 2018/0286928 A1 | 10/2018 | Tong |

FOREIGN PATENT DOCUMENTS

| | | |
|---|---|---|
| CN | 105552099 A | 5/2016 |
| CN | 105576002 A | 5/2016 |
| CN | 106067478 A | 11/2016 |
| CN | 106229300 A | 12/2016 |
| CN | 106601783 A | 4/2017 |

\* cited by examiner

PIXEL STRUCTURE OF OLED DISPLAY PANEL AND MANUFACTURING METHOD THEREOF

FIELD OF THE INVENTION

The present disclosure relates to the technical field of display manufacturing, and particularly to a pixel structure of an organic light emitting diode (OLED) display panel and a manufacturing method thereof.

BACKGROUND OF THE INVENTION

Known display types mainly include liquid crystal displays and organic light emitting diode (OLED) displays. Liquid crystal displays have advantages such as having a thin body, reduced power consumption, low radiation, etc, as well as being widely used. Most of the liquid crystal displays on the market are backlight type liquid crystal displays. Each backlight type liquid crystal display includes a liquid crystal panel and a backlight module. Working principle of the liquid crystal panel disposes liquid crystal molecules between two parallel glass substrates, applying a driving voltage between the glass substrates to control rotational direction of the liquid crystal molecules, and then generating a picture by light transmitted from the backlight module.

Thin film transistor liquid crystal displays (TFT-LCD) have been rapidly developed and widely used in recent years due to their advantages, such as low power consumption, excellent picture quality, and high production yield. Specifically, the TFT-LCD is a layer of liquid crystals sandwiched between the two glass substrates, with a color filter disposed on the upper glass substrate, and thin film transistors disposed on the lower glass substrate. An electric field variation is generated when the current passes through the thin film transistor, a deflection of the liquid crystal molecules is caused by the electric field variation, and thereby polarity of the light is changed to achieve a desired display picture.

OLED display technology is different from traditional LCD display technology. For example, OLEDs do not require a backlight source, a very thin organic material coating is applied to the OLED, and the organic material coating is self-illuminating when current passes through it. The OLEDs have advantages such as having a high contrast, a wide color gamut, flexibility, a thin, light body, reduced energy consumption, etc, in recent years, the OLED display technology has gradually become widely used in the field of mobile devices, such as smart phones and tablet computers, the field of flexible wearable devices such as smart watches, the field of the large size curved-televisions (TV), and the field of white lighting. Momentum of the development of OLEDs is strong.

For OLED displays, some of the known OLED devices are produced by a vacuum deposition technology via a vapor deposition apparatus, others are produced by an ink-jet printing technology. For the OLED devices produced by the ink-jet printing technology, the prior art is shown as FIG. 1 and FIG. 2. FIG. 1 shows a pixel structure formed by the ink-jet printing technology in the prior art. FIG. 2 shows a pixel region structure as shown in the FIG. 1. The pixel structure 1 comprises a plurality of pixel units 2 and a plurality of pixel regions 4. Each of pixel regions 4 comprises a plurality of sub-pixel regions 5. The pixel units 2 are formed in the sub-pixel regions 5 by the ink-jet printing technology. Each pixel unit 2 comprises a plurality of sub-pixels 3 such as red pixels, green pixels, and blue pixels. Each of sub-pixels is formed in each of the sub-pixel regions.

In actual production process, the pixel region or the sub-pixel region is specifically formed by disposing a layer of a substrate on a light emitting region, and then providing a plurality of slots spaced from each other on the substrate, so as to form the sub-pixel regions. Next, a nozzle of an ink-jet printer is arranged toward the slots, which drops pixel material into each of the sub-pixel regions. Since a space in each slot of each sub-pixel region is small, the nozzle is not easily aligned with the sub-pixel regions. The pixel materials may easily drop in other positions out of the sub-pixel regions. In addition, since the space in each slot of each sub-pixel region is small, the pixel material in the slots easily overflow when a few drops of pixel material are dropped from the nozzle. It causes each of the pixel units to have an uneven thickness, and mura (spots) easily appear.

SUMMARY OF THE INVENTION

An objective of the present disclosure is to provide a pixel structure, which increases areas of the sub-pixels integrally formed in the sub-pixel region group, so as to form the sub-pixels easily. Therefore, a thickness uniformity of each of the sub-pixels is improved, a possibility of generating the mura is reduced, and a utilization of the pixel materials is improved.

Another objective of the present disclosure is to provide a manufacturing method of the pixel structure, in which an area of the sub-pixels integrally formed in the sub-pixel region group is increased, so as to easily form the sub-pixels. Therefore, a thickness uniformity of each of the sub-pixels is improved, a possibility of generating the mura is reduced, and a utilization of the pixel materials is improved.

In order to resolve the above problems, a pixel structure is provided in a preferred embodiment of the present disclosure, the pixel structure comprises:

a pixel region, comprising a plurality of sub-pixel regions arranged in sequence, at least two adjacent sub-pixel regions defined as a sub-pixel region group, at least two sub-pixel regions disposed integrally in the sub-pixel region group;

at least two anode conductive layers, disposed in the sub-pixel regions respectively, the anode conductive layers in the sub-pixel region group separated from each other;

a plurality of pixel units, each of the pixel units comprising a plurality of sub-pixels and disposed in the pixel region, each of the sub-pixels disposed in one of the sub-pixel regions, the sub-pixels formed integrally and have a same color in the sub-pixel region group;

a cathode conductive layer, electrically connected with the anode conductive layers to control the pixel units;

the sub-pixel region group comprising four half-sub-pixel regions, any one of the four half-sub-pixel regions adjacent to two of the four half-sub-pixel regions.

Each of the pixel units comprises:

a hole injection layer formed by injecting a hole material into the sub-pixel region group, the hole injection layer located on the anode conductive layer;

a luminous layer formed by injecting a luminous material into the sub-pixel region group, the luminous layer located on the hole injection layer; and an electron injection layer formed by injecting an electron material into the sub-pixel region group, the electron injection layer located on the luminous layer; wherein the cathode conductive layer is located on the electron injection layer.

In the pixel structure of the preferred embodiment of the present disclosure, an edge of the sub-pixel region group is made of a hydrophobic oleophobic material. The sub-pixel region group is formed on a hydrophobic oleophobic material, which is specifically shaped as a structure of a slot, with a plurality of sidewalls at a periphery of the slot made of the hydrophobic oleophobic material.

In the pixel structure of the preferred embodiment of the present disclosure, a profile of the sub-pixel region group is elliptical in shape. The profile may also be shaped as other shapes, such as rectangular, round, and the like.

The pixel structure of the preferred embodiment of the present disclosure further comprises at least two insulation layers, wherein the insulation layers surround at an edge of each of the anode conductive layers, and the insulation layers are located at adjacent positions where are on different anode conductive layers. It is able to prevent a short circuit due to protrusions between the anode conductive layers and the cathode conductive layer.

In the pixel structure of the preferred embodiment of the present disclosure, the sub-pixels comprise red pixels, green pixels, and blue pixels.

In the pixel structure of the preferred embodiment of the present disclosure, the sub-pixels comprise white pixels, red pixels, green pixels, and blue pixels.

In order to resolve the above problems, another pixel structure is also provided in a preferred embodiment of the present disclosure, the pixel structure comprises:
a pixel region, comprising a plurality of sub-pixel regions arranged in sequence, at least two adjacent sub-pixel regions defined as a sub-pixel region group, at least two sub-pixel regions disposed integrally in the sub-pixel region group;
at least two anode conductive layers, disposed in the sub-pixel regions respectively, the anode conductive layers in the sub-pixel region group separated from each other;
a plurality of pixel units, each of the pixel units comprising a plurality of sub-pixels and disposed in the pixel region, each of the sub-pixels disposed in one of the sub-pixel regions, the sub-pixels formed integrally and have a same color in the sub-pixel region group;
a cathode conductive layer electrically connected to the anode conductive layers to control the pixel units;
each of the pixel units comprising:
a hole injection layer formed by injecting a hole material into the sub-pixel region group, the hole injection layer located on the anode conductive layer;
a luminous layer formed by injecting a luminous material into the sub-pixel region group, the luminous layer located on the hole injection layer; and
an electron injection layer formed by injecting an electron material into the sub-pixel region group, the electron injection layer located on the luminous layer; wherein the cathode conductive layer is located on the electron injection layer.

In the pixel structure of the preferred embodiment of the present disclosure, the sub-pixel region group comprises two sub-pixel regions. The two adjacent of the sub-pixel regions may be located in a same row or a same column. The pixel region may be formed of a plurality of sub-pixel regions in a plurality of rows or columns. The pixel structure of the preferred embodiment of the present disclosure is preferably a single sub-pixel region group formed by the two adjacent sub-pixel regions in the same row, thereby a plurality of adjacent sub-pixel region group are formed of a plurality of sub-pixel regions in the same row. The hole material, the luminous material, and the electron material may be injected into the sub-pixel region group by the ink-jet printing technology, so as to form the hole injection layer, the luminous layer and the electron injection layer respectively. Thus, two of the sub-pixels are formed integrally. Compared with two sub-pixels which are respectively coated in two sub-pixel regions separated from each other, the present disclosure has increased an area for injection. It is convenient to inject the hole material, the luminous material, and the electron material into the sub-pixel region group, so as to improve the utilization of the pixel material and a thickness uniformity of the sub-pixels, and to reduce a possibility of producing the mura. Furthermore, it is convenient to apply the pixel structure to OLED display panels with a higher resolution.

In the pixel structure of the preferred embodiment of the present disclosure, the sub-pixel region group comprises four sub-pixel regions, any one of the four sub-pixel regions is adjacent to two of the four sub-pixel regions. That is, there are two adjacent sub-pixel regions in two adjacent rows respectively. Alternatively, there are two adjacent sub-pixel regions in two adjacent columns respectively. A single sub-pixel region group is formed of four sub-pixel regions. The pixel region comprises a plurality of sub-pixel region groups. The hole material, the luminous material, and the electron material may be injected into the sub-pixel region group by the ink-jet printing technology, so as to form the hole injection layer, the luminous layer, and the electron injection layer respectively, thereby integrally forming four sub-pixels. Compared with four sub-pixels being respectively coated in two sub-pixel regions separated from each other, the present disclosure has increased an area for injection. It is convenient to inject the hole material, the luminous material, and the electron material into the sub-pixel region group, so as to improve the utilization of the pixel material, a thickness uniformity of the sub-pixels, and to reduce a possibility of producing the mura. Furthermore, it is convenient to apply the pixel structure to OLED display panels with a higher resolution.

In the pixel structure of the preferred embodiment of the present disclosure, an edge of the sub-pixel region group is made of a hydrophobic oleophobic material. The sub-pixel region group is formed of a hydrophobic oleophobic material, which is specifically shaped as a structure of a slot, with a plurality of sidewalls at a periphery of the slot made of the hydrophobic oleophobic material.

In the pixel structure of the preferred embodiment of the present disclosure, a profile of the sub-pixel region group is elliptical in shape. The profile may also be shaped as other shapes, such as rectangular, round, and the like.

In the pixel structure of the preferred embodiment of the present disclosure, the sub-pixels comprise red pixels, green pixels, and blue pixels.

In the pixel structure of the preferred embodiment of the present disclosure, the sub-pixels comprise white pixels, red pixels, green pixels, and blue pixels.

The pixel structure of the preferred embodiment of the present disclosure further comprises at least two insulation layers, wherein the insulation layers surround at an edge of each of the anode conductive layers, and the insulation layers are located at adjacent positions where are on different anode conductive layers. This prevents a short circuit due to protrusions between the anode conductive layers and the cathode conductive layer.

In order to resolve the above problem, a manufacturing method of a pixel structure is also provided in a preferred embodiment of the present disclosure, the manufacturing method comprises steps of:

forming at least two anode conductive layers on a substrate;

forming a pixel region on the substrate, the pixel region comprising a plurality of sub-pixel regions arranged in sequence, at least two adjacent sub-pixel regions defined as a sub-pixel region group on the substrate, at least two sub-pixel regions disposed integrally in the sub-pixel region group;

forming two of at least two anode conductive layers in the sub-pixel region respectively, the anode conductive layers in the sub-pixel region group separated from each other;

forming a plurality of pixel units in the pixel region, each of the pixel units comprising a plurality of sub-pixels, forming one of the sub-pixels in each of sub-pixel regions, at least two sub-pixels formed integrally and having a same color in the sub-pixel region group; and forming a cathode conductive layer on the substrate, the cathode conductive layer electrically connected with the anode conductive layers, to control the pixel units; each of the pixel units comprising:

a hole injection layer formed by injecting a hole material into the sub-pixel region group, the hole injection layer located on the anode conductive layer;

a luminous layer formed by injecting a luminous material into the sub-pixel region group, the luminous layer located on the hole injection layer; and an electron injection layer formed by injecting an electron material into the sub-pixel region group, the electron injection layer located on the luminous layer; wherein the cathode conductive layer is located on the electron injection layer.

In the manufacturing method of the pixel structure of the preferred embodiment of the present disclosure, the step of forming the pixel region on the substrate comprises: forming a hydrophobic oleophobic layer with a hydrophobic oleophobic material on the substrate; and forming the pixel region on the hydrophobic oleophobic layer. The sub-pixel region group is formed of the hydrophobic oleophobic material. Specifically, the sub-pixel region is shaped as a structure of a slot, with a plurality of sidewalls at the periphery of the slot made of the hydrophobic oleophobic material.

The manufacturing method of the pixel structure of the preferred embodiment of the present disclosure further comprises: forming at least two insulation layers on the substrate, wherein the insulation layers surround at an edge of each of the anode conductive layers, and the insulation layers are located at adjacent positions where are on different anode conductive layers. This prevents the short circuit due to protrusions between the anode conductive layers and the cathode conductive layer.

In the manufacturing method of the pixel structure of the preferred embodiment of the present disclosure, a single sub-pixel region group is formed of two adjacent of the sub-pixel regions on the substrate.

In the manufacturing method of the pixel structure of the preferred embodiment of the present disclosure, a single sub-pixel region group is formed of two adjacent of the sub-pixel regions on the substrate, any one of the four sub-pixel regions is adjacent to two of the four sub-pixel regions.

In the manufacturing method of the pixel structure of the preferred embodiment of the present disclosure, a profile of the sub-pixel region group is elliptical in shape. The profile may also be shaped as other shapes, such as rectangular, round, and the like.

In the manufacturing method of the pixel structure of the preferred embodiment of the present disclosure, the sub-pixels comprise red pixels, green pixels, and blue pixels.

In the manufacturing method of the pixel structure of the preferred embodiment of the present disclosure, the sub-pixels comprise white pixels, red pixels, green pixels, and blue pixels.

In the manufacturing method of the pixel structure of the preferred embodiment of the present disclosure, a single sub-pixel region group comprises four half sub-pixel regions, any one of the four half sub-pixel regions is adjacent to two of the four half sub-pixel regions.

Compared with the prior art, at least two adjacent sub-pixel region of the present disclosure may be located in a same row or a same column, and also located in two adjacent rows or columns. The pixel region may be formed of a plurality of sub-pixel regions in a plurality of rows or columns, as well as formed of a plurality of sub-pixel region in a plurality of columns and rows. In the present disclosure, the hole material, the luminous material, and the electron material may be injected into the sub-pixel region group by ink-jet printing technology, so as to form a hole injection layer, a luminous layer, and an electron injection layer respectively, thereby integrally forming two or more sub-pixels.

Compared with two or more sub-pixels being respectively coated in two or more sub-pixel regions separated from each other, the present disclosure has increased an area for injection. It is convenient to inject the hole material, the luminous material, and the electron material into the sub-pixel region group, so as to improve the utilization of the pixel material and a thickness uniformity of the sub-pixels. Furthermore, it is convenient to apply the pixel structure to OLED display panels with a higher resolution.

Thus, each of the anode conductive layers and the cathode conductive layer, both in a single sub-pixel region group, are connected, which controls a part of the sub-pixels contacted with the anode conductive layer to emit light.

In order that the foregoing of the present disclosure will become more apparent, the preferred embodiments are given hereafter and are to be described in detail with reference to the accompanying drawings.

DETAILED DESCRIPTION OF THE PREFERRED EMBODIMENTS

Figure 1:
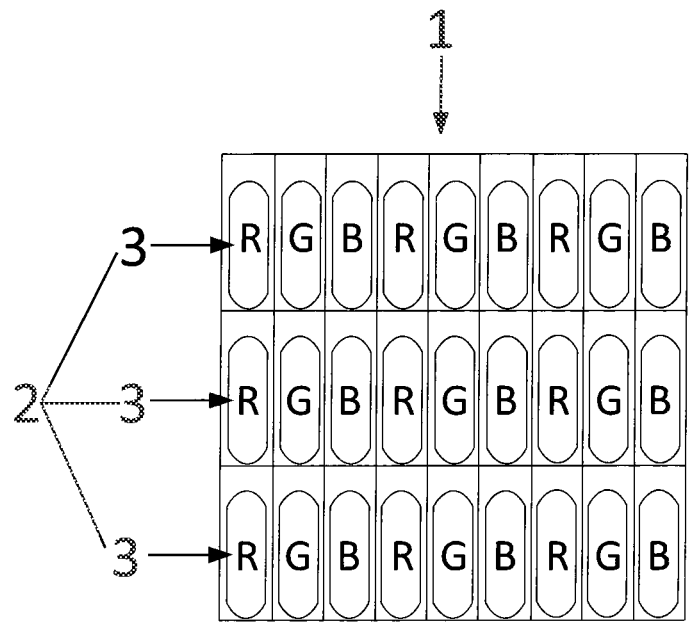
FIG. 1 is a structural diagram that illustrates a pixel structure in the prior art.
Figure 2:
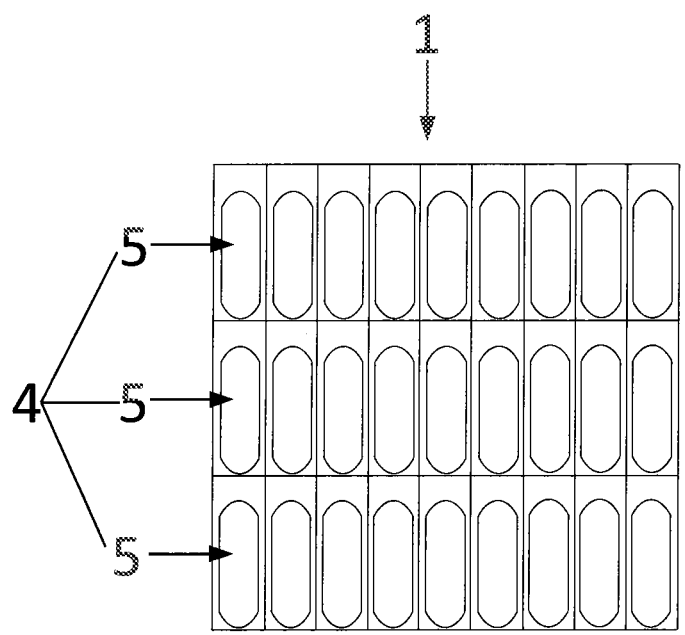
FIG. 2 is a structural diagram that illustrates a pixel region in the prior art.

The following description of the embodiments is given by reference to the accompanying drawings for illustrating specific embodiments in which the disclosure may be embodied.

The specific structural and functional details disclosed herein are merely representative and are intended to describe the purpose of the exemplary embodiments of the present disclosure. The disclosure may be embodied in many substituted forms and should not be construed as limited to the embodiments set forth herein only.

In the description of the present disclosure, it is to be understood that the terms "center", "transverse", "up", "down", "left", "right", "vertical", "horizontal", "top", "bottom", "inside", "outside", and the like, indicate orientations or positional relationships, and are based on the orientations or positional relationships shown in the drawings, merely for the purpose of facilitating the description of the disclosure and the simplified description, rather than indicating or implying that the devices or elements have to have a specific orientation, or be constructed and operated in a particular orientation, and therefore may not be construed as limits to the present disclosure. In addition, the terms "first" and "second" are merely used for illustrative purposes only, but are not to be construed as indicating or imposing a relative importance or implicitly indicating the number of technical features indicated. Thus, a feature that defines "first" or "second" may expressly or implicitly comprise one or more of the features. In the description of the present disclosure, the meaning of "plural" is two or more, unless otherwise specified. In addition, the term "comprising" and any variations thereof are intended to cover non-exclusive inclusion.

In the description of the present disclosure, it should be noted that, unless otherwise expressly stated and defined, the terms "installation", "interconnection", and "connection", should be broadly understood; for example, it may be a fixed connection, either a detachable connection or integral connection; it may be a mechanical connection or an electrical connection; it may be a directed connection or indirected connection via an intermediate medium, or internal connection between two devices. The specific meaning of the above terms of the present disclosure will be apparent to those skilled in the art.

The terminology used herein is for the purpose of describing particular embodiments only and is not intended to limit the exemplary embodiments. Unless the context clearly dictates otherwise, the singular forms "a" and "an", as used herein, are also intended to include the plural. It should also be understood that the terms "comprise" and/or "include" both mean a presence of characteristics, integers, steps, operations, units and/or components stated in the specification, and do not exclude the presence or addition of one or more other features, integers, operations, units, components and/or combinations thereof.

In the drawings, the units with similar structures are denoted by the same reference numerals.

An OLED display, an OLED display panel, a pixel structure of the OLED display panel, and manufacturing methods thereof in the present disclosure will be described in further detail with reference to FIGS. 3 to 8 and the preferred embodiments.

The pixel structure of the OLED display panel is disclosed in an embodiment of the present disclosure, which may be provided in the OLED display panel. The OLED display panel may be provided in the OLED display. In other words, the OLED display panel or the OLED display in the embodiment of the present configurations comprises the pixel structure in any one of the following embodiments.

First Embodiment

Figure 3:
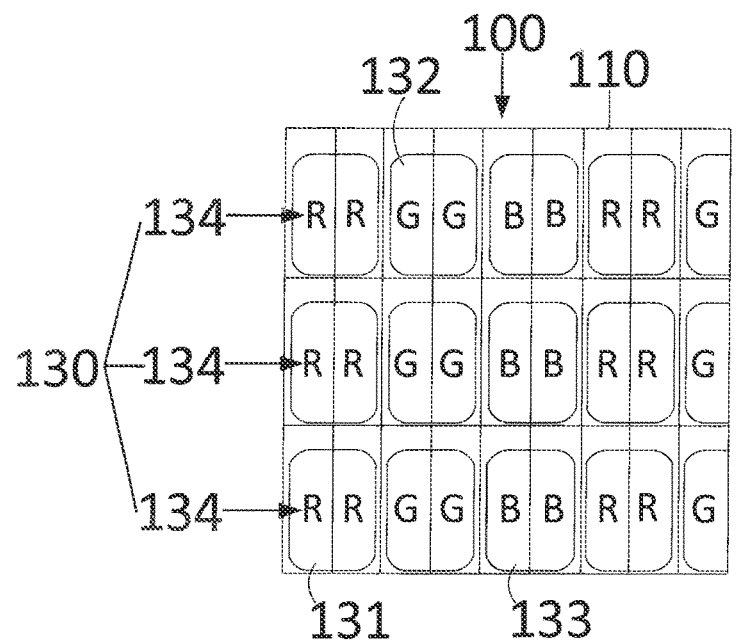
FIG. 3 is a structural diagram that illustrates a pixel structure in accordance with a first embodiment of the present disclosure.
Figure 4:
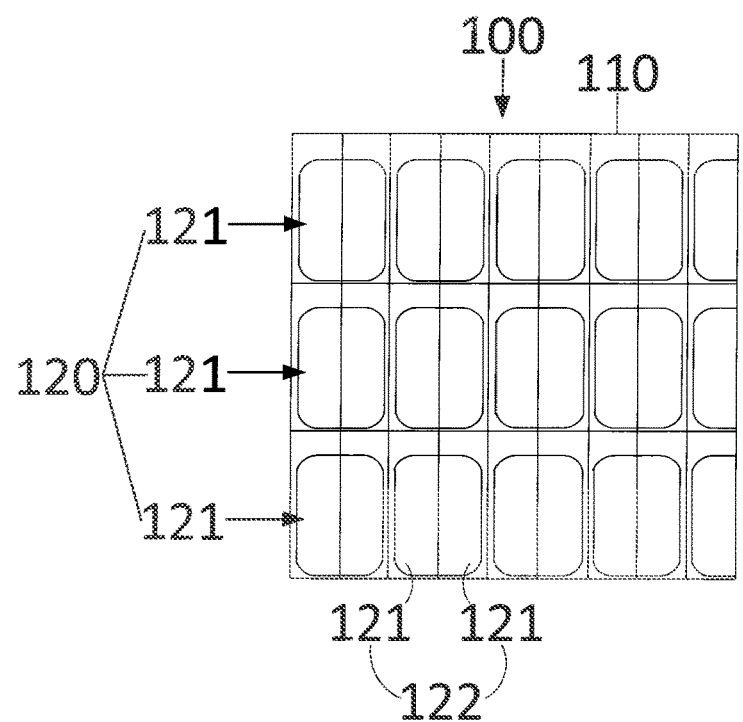
FIG. 4 is a structural diagram that illustrates a pixel region in accordance with the first embodiment of the present disclosure.
Figure 5:
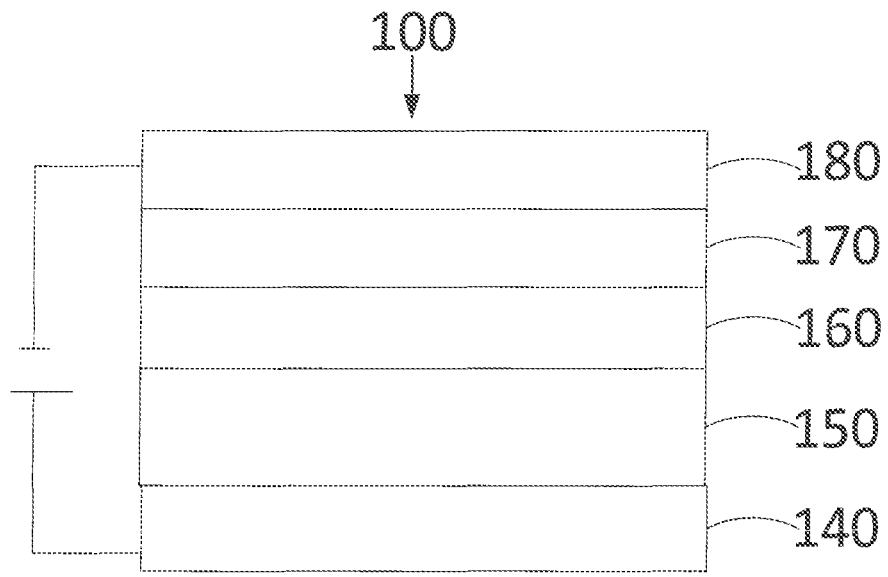
FIG. 5 is a cross-sectional structure illustration of a pixel structure in accordance with the first embodiment of the present disclosure.

The first embodiment of the present configurations is shown in FIGS. 3 to 5. FIG. 3 is a structural diagram that illustrates a pixel structure in accordance with the first embodiment of the present configurations. FIG. 4 is a structural diagram that illustrates a pixel region in accordance with the first embodiment of the present configurations. FIG. 5 is a diagram of a cross-section structure illustration of a pixel structure in accordance with the first embodiment of the present configurations. The embodiment of the present configurations will be described in detail with reference to the pixel structure of the OLED display panel. It should be noted that the description of the pixel structure is also applicable to the OLED display panel or the OILED display.

The pixel structure 100 in the first embodiment of the present configurations comprises a substrate 110, a pixel region 120, a plurality of pixel units 130, at least two anode conductive layers 140, and a cathode conductive layer 180.

The substrate 110 may be a glass plate which is a good transparent material and easy to install. It should be noted that the substrate 110 of the present embodiment is not limited thereto, and may comprise other types such as a flexible substrate.

The pixel region 120 is formed on the substrate 110, specifically, the pixel region 120 comprises a plurality of sub-pixel regions 121 arranged in sequence. At least two adjacent sub-pixel regions 121 are defined as a sub-pixel region group 122 on the substrate 110, and at least two sub-pixel regions 121 are disposed integrally in the sub-pixel region group 122.

More specifically, the pixel region 120 formed of a plurality of sub-pixel regions in a plurality of rows or a plurality of columns, and the pixel region 120 may also be formed of a plurality of sub-pixel regions in a plurality of columns and a plurality of rows. At least two adjacent sub-pixel regions 121 are defined as a sub-pixel region group 122. It should be noted that two adjacent sub-pixel regions 121 are defined as a single sub-pixel region group 122 as an example used in the first embodiment of the present configurations. Two sub-pixel regions 121 in a same sub-pixel region group 122 may be in a same row or a same column. This embodiment of the present configurations illustrates an example in which a single sub-pixel region group is formed of two sub-pixel regions in the same row.

At least two anode conductive layers 140 are formed on the substrate 110, as well as formed in the sub-pixel region 121 respectively. The anode conductive layers 140 in the sub-pixel region group 122 are separated from each other. The material of the anode conductive layer may be indium tin oxide (ITO). The distance between the anode conductive layers 140 may be 4 micrometers (μm). Specifically, in a single sub-pixel region group, there are two anode conductive layers cooperating with it.

The cathode conductive layer 180 and the anode conductive layers 140 are electrically connected via a switch to control the pixel unit. Each of the anode conductive layers 140 controls the sub-pixels 134 corresponding thereto respectively. Material of the cathode conductive layer may be indium tin oxide (ITO).

After forming the anode conductive layer 140 on the substrate 110, a hydrophobic oleophobic material may be placed on the anode conductive layer, so as to form a hydrophobic oleophobic layer with hydrophobic oleophobic capability. Next, a plurality of slot structures may be formed on the hydrophobic oleophobic layer.

For example, one of the slot structures may be elliptical, rectangular, or a structure bounded by an arc and a rectangular surface. The slot structure is the sub-pixel region group. The slot structure may be sized so that it occupies an area of two sub-pixels. In other words, a single slot structure is formed of two of the sub-pixel regions, and is disposed integrally in the interior of the sub-pixel regions without blocking or shielding. A single complete pixel region is formed of a plurality of sub-pixel region groups. At the bottom of one such sub-pixel region group there are two anode conductive layers 140, and a plurality of sidewalls that have the hydrophobic oleophobic material.

It should be noted that before the hydrophobic oleophobic material is positioned on the anode conductive layer, the insulation layers may further surround edges of each of the anode conductive layers. In a single pixel region group, the insulation layers are located at adjacent positions which are on different anode conductive layers. Width of the insulation layer may be 7 μm, and the material of the insulation layer may be silicon oxide to prevent short circuiting between the anode conductive layers and the cathode conductive layer.

Each of pixel units 130 comprises a plurality of sub-pixels 134 disposed in the pixel region 120, each of the sub-pixels 134 is disposed in one of the sub-pixel regions 121, two of the sub-pixels 134 are formed integrally and have a same color in the sub-pixel region group 122. The sub-pixels 134 may comprise red pixels 131, green pixels 132, and blue pixels 133. It should be noted that the sub-pixels 134 are not limited to the above pixels, and may comprise white pixels, and the like.

Each of the pixel units comprises a hole injection layer 150, a luminous layer 160, and an electron injection layer 170.

The hole injection layer 150 is formed by using an ink-jet printer to inject a hole (electric hole) material into the sub-pixel regions, and the hole injection layer is located on the anode conductive layer.

The luminous layer 160 is formed by using the ink-jet printer to inject a luminous material into the sub-pixel regions, and the luminous layer is located on the anode conductive layer.

The electron injection layer 170 is formed by using the ink-jet printer to inject an electron material into the sub-pixel regions, and the electron injection layer is located on the luminous layer.

The cathode conductive layer 180 is located on the electron injection layer.

The hole material, the luminous material, and the electron material are respectively injected into the sub-pixel region group by ink-jet printing technology in this embodiment of the present configurations, so as to form the hole injection layer, the luminous layer, and the electron injection layer respectively, and two of the sub-pixels are formed integrally. Compared with the prior art, the present configurations have increased an area for injection. It is convenient to inject the hole material, the luminous material, and the electron material into the sub-pixel region group, so as to improve the utilization of the pixel material and a thickness uniformity of the sub-pixels, and to reduce possibility of mura. Furthermore, it is convenient to apply the pixel structure to OLED display panels with a higher resolution.

Thus, each of the anode conductive layers and the cathode conductive layer in a single sub-pixel region group are connected to control a part of the sub-pixels contacted with the anode conductive layer to emit light. Another part of two anode conductive layers separated from each other in a single sub-pixel region group does not emit light.

For example, two green pixels 132 are disposed in two sub-pixel regions 121 in the same sub-pixel region group 122. Specifically, the hold material, a green luminous material, and the electron material are coated in the sub-pixel region group 122 applied by the ink-jet printing technology, so as to form two green pixels formed integrally. More specifically, the hold material, the green luminous material, and the electron material are dropped into the sub-pixel region group 122 by a nozzle of an ink-jet printer. The hold material, the green luminous material, and the electron material are formed into a plurality of integral structures in a single sub-pixel region group 122, respectively. In other words, two green pixels are formed integrally. Thus, the two green pixels are formed integrally in a same process.

It should be noted that a single sub-pixel region group is formed of two sub-pixel regions of the same column, which may also be achieved in the embodiment of the present configurations. It may be referred to the above description, it will not be described redundantly here.

Second Embodiment

Figure 6:
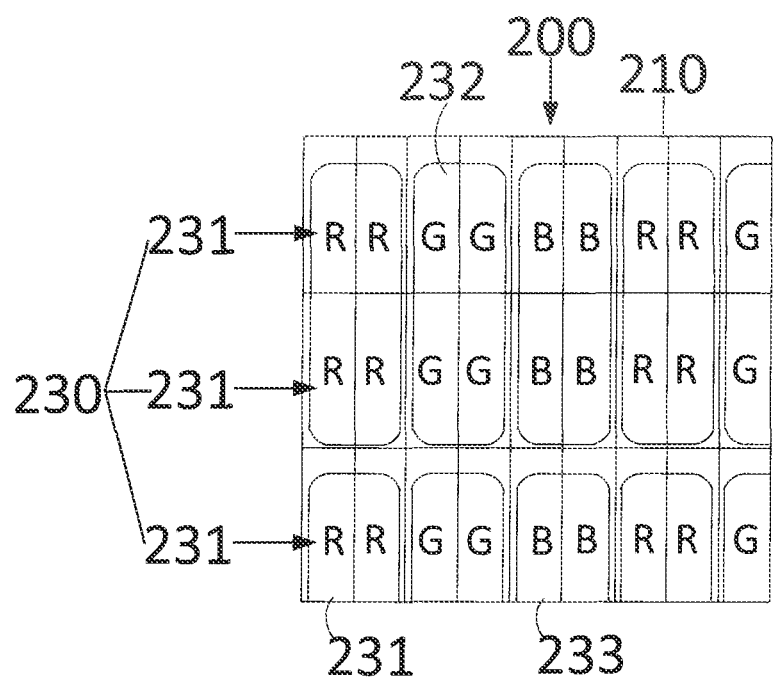
FIG. 6 is a structural diagram that illustrates a pixel structure in accordance with a second embodiment of the present disclosure.
Figure 7:
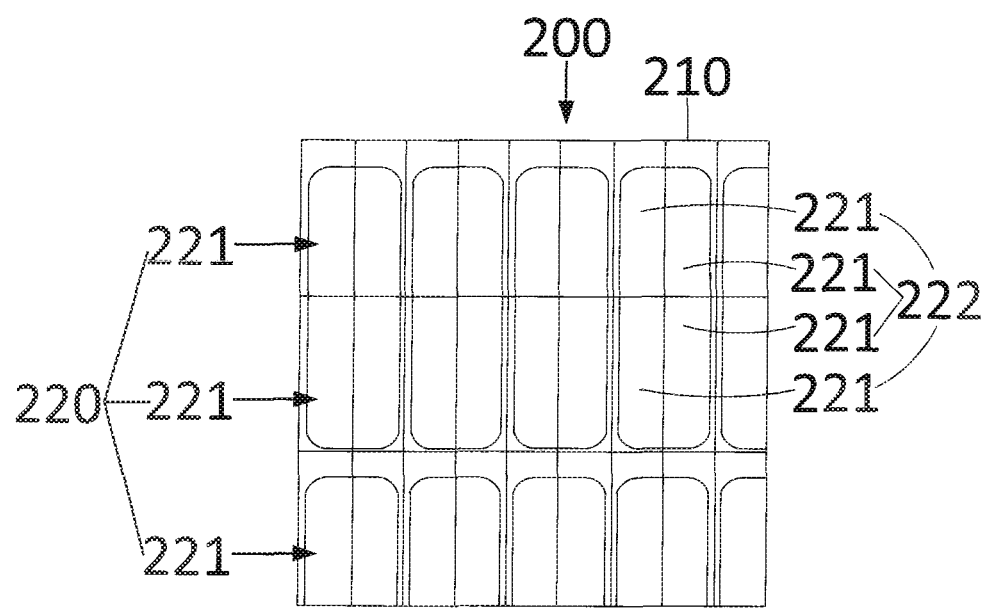
FIG. 7 is a structural diagram that illustrates a pixel region in accordance with the second embodiment of the present disclosure.

The second embodiment of the present configurations is shown in FIGS. 6 to 7. FIG. 6 is a structural diagram that illustrates a pixel structure in accordance with the second embodiment of the present configurations. FIG. 7 is a structural diagram that illustrates a pixel region in accordance with the second embodiment of the present configurations. FIGS. 6 to 7 are cooperated with FIGS. 3 to 5. The embodiment of the present configurations will be described in detail with reference to the pixel structure of the OLED display panel. It should be noted that the description of the pixel structure is also applicable to the OLED display panel or the OLED display.

The pixel structure 200 in the second embodiment of the present configurations comprises a substrate 210, a pixel region 220, a plurality of pixel units 230, a plurality of anode conductive layers, and a cathode conductive layer.

The substrate 210 may be referred to the substrate 110 in the first embodiment.

Red pixels 231, green pixels 232, and blue pixels 233 may be referred to the red pixels 131, green pixels 132, and blue pixels 133 in the first embodiment, respectively, so it will not be repeated again here.

The second embodiment of the present configurations differs from the first embodiment in that a single sub-pixel region group 222 formed of four adjacent sub-pixel regions 221 are applied in the second embodiment.

Specifically, any one of the four sub-pixel regions 221 is adjacent to two of the four sub-pixel regions 221. That is, there are two adjacent sub-pixel regions 221 in two adjacent rows respectively. Alternatively, there are two adjacent sub-pixel regions 221 in two adjacent columns respectively. A single sub-pixel region group 222 is formed of four sub-pixel regions. The pixel region 220 comprises a plurality of sub-pixel region groups 222. Four sub-pixels are formed integrally and have a same color in a same sub-pixel region group 222. Compared with four sub-pixels being respectively coated in two sub-pixel regions separated each other, the present configurations increase an area for injection. It is convenient to inject the hole material, the luminous material, and the electron material into the sub-pixel region group, so as to improve the utilization of the pixel material, a thickness uniformity of the sub-pixels, and to reduce a possibility of producing the mura. Furthermore, it is convenient to apply the pixel structure to OLED display panels with a higher resolution.

It should be noted that in a single sub-pixel region group, there are four anode conductive layers which are cooperated with the sub-pixel region group. The four anode conductive layers are separated from each other. The anode conductive layers and the cathode conductive layer are electrically connected via a switch, specifical structures and configurations of the anode conductive layers and the cathode conductive layer may also be referred to the first embodiment, and will not be repeated again here.

It should be noted that there are four sub-pixels in a single sub-pixel region group, the implementation of injecting the hole material, the luminous material, and the electron material toward a single sub-pixel region group is the same as the first embodiment, and will not be repeated again here. Furthermore, the other configurations and effects both of the pixel region and the pixel unit in the second embodiment of the present configurations are the same as the first embodiment respectively, and will not be repeated again here.

For example, four red pixels 231 are disposed in four sub-pixel regions 221 in a same sub-pixel region group 222. Specifically, the hole material, a red luminous material, and the electron material are coated in the sub-pixel region group 222 applied by the ink-jet printing technology, so as to form four red pixels 231 formed integrally. More specifically, the hold material, the red luminous material, and the electron material are dropped into the sub-pixel region group 222 by a nozzle of an ink-jet printer. The hold material, the red luminous material, and the electron material are formed into a plurality of integral structures in a single sub-pixel region group 222, respectively. In other words, the four red pixels 231 are formed integrally. Thus, the four red pixels 231 are respectively formed integrally in a same process.

The sub-pixel region group of the pixel region of the present configurations is not limited in the first and second embodiments. It should be noted that the first and second embodiments are merely two configurations of the sub-pixel region, which may also have other configurations, such as a single sub-pixel region group is formed of three adjacent sub-pixel regions arranged in sequence in a same row, a single sub-pixel region group is formed of three adjacent sub-pixel regions arranged in sequence in a same column, and a single sub-pixel region group comprises a half of four adjacent sub-pixel regions.

Third Embodiment

Figure 8:
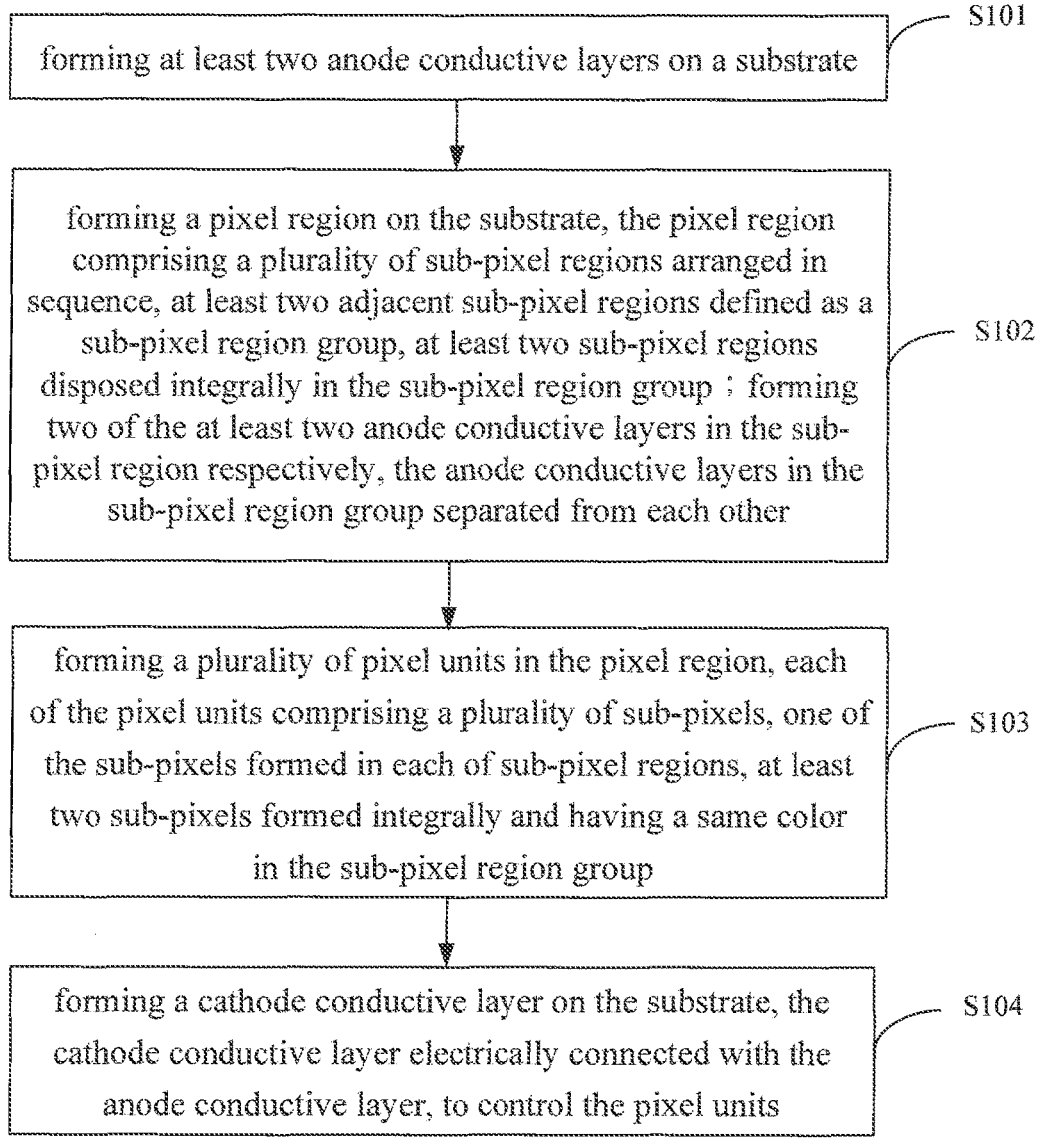
FIG. 8 is a diagram of a flowchart of a manufacturing method of a pixel structure in accordance with a third embodiment of the present disclosure.

The third embodiment of the present configurations is shown in FIG. 8. FIG. 8 is a diagram of a flowchart of a manufacturing method of a pixel structure in accordance with a third embodiment of the present configurations. FIG. 8 is cooperated with FIGS. 3 to 7. The manufacturing method of the pixel structure comprises steps of:

Step S101, forming at least two anode conductive layers on a substrate.

Step S102, forming a pixel region on the substrate, the pixel region comprising a plurality of sub-pixel regions arranged in sequence, at least two adjacent sub-pixel regions defined as a sub-pixel region group, at least two sub-pixel regions disposed integrally in the sub-pixel region group; forming two of the at least two anode conductive layers in the sub-pixel region respectively, the anode conductive layers in the sub-pixel region group separated from each other.

Step S103, forming a plurality of pixel units in the pixel region, each of the pixel units comprising a plurality of sub-pixels, one of the sub-pixels formed in each of sub-pixel regions, at least two sub-pixels formed integrally and having a same color in the sub-pixel region group.

Step S104, forming a cathode conductive layer on the substrate, the cathode conductive layer electrically connected with the anode conductive layers, to control the pixel units.

The substrate may be, for example, a glass plate, which is a good transparent material and easy to install. It should be noted that the substrate of the present embodiment is not limited thereto, and may comprise other types, such as a flexible substrate.

The pixel region is formed on the substrate. Specifically, the pixel region comprises a plurality of sub-pixel regions arranged in sequence, at least two adjacent sub-pixel regions defined the sub-pixel region group on the substrate, at least two sub-pixel regions disposed integrally in the sub-pixel region group.

More specifically, the pixel region is formed of a plurality of sub-pixel regions in a plurality of rows or a plurality of columns, the pixel region may also be formed of a plurality of sub-pixel regions in a plurality of columns and a plurality of rows. At least two adjacent sub-pixel regions are formed into a single sub-pixel region group.

At least two anode conductive layers are formed on the substrate, as well as formed in the sub-pixel region respectively. The anode conductive layers in the sub-pixel region group are separated from each other. The material of the anode conductive layer may be indium tin oxide (ITO). The distance between the anode conductive layers may be 4 micrometers ($\mu m$). Specifically, in a single sub-pixel region group, there are two anode conductive layers cooperated with the sub-pixel region group.

The cathode conductive layer and the anode conductive layers are electrically connected via a switch to control the pixel units. Each of the anode conductive layers control the sub-pixels corresponding thereto respectively. The material of the cathode conductive layer may be indium tin oxide (ITO).

After forming the anode conductive layer on the substrate, a hydrophobic oleophobic material may be positioned on the anode conductive layer, so as to form a hydrophobic oleophobic layer with hydrophobic oleophobic ability. Next, a plurality of slot structures may be formed on the hydrophobic oleophobic layer.

For example, one of the slot structures may be shaped as a slot structure of an ellipse, a slot structure of a rectangle, a slot structure cooperated by an arc surface and a rectangular surface, and the like. The slot structure is the sub-pixel region group. The slot structure may be of a size that occupies an area of two sub-pixels. In other words, a single slot structure is formed of two of the sub-pixel regions, which are disposed integrally in the interior thereof without blocking or shielding. So that a single complete pixel region is formed of a plurality of sub-pixel region groups. The bottom of one such sub-pixel region group has two anode conductive layers and a plurality of sidewalls that have the hydrophobic oleophobic material.

It is to be noted that before the hydrophobic oleophobic material is positioned on the anode conductive layer, the insulation layers may further surround edges of each of the anode conductive layers. In a single pixel region group, the insulation layers are located at adjacent positions on different anode conductive layers. A width of the insulation layer may be 7 μm, and the material of the insulation layer may be silicon oxide to prevent a short circuit from forming between the anode conductive layers and the cathode conductive layers.

Each of pixel units comprises a plurality of sub-pixels disposed in the pixel region, each of the sub-pixels is disposed in a single sub-pixel region, two of the sub-pixels are formed integrally and have the same color in the sub-pixel region group. The sub-pixels may comprise red pixels, green pixels, and blue pixels. It should be noted that the sub-pixel is not limited to the above pixels, and may comprise white pixels, and the like.

Each of the pixel units comprises a hole injection layer, a luminous layer, and an electron injection layer.

The hole injection layer is formed by using an ink-jet printer to inject a hole material into the sub-pixel regions, and the hole injection layer is located on the anode conductive layer.

The luminous layer is formed by using the ink-jet printer to inject a luminous material into the sub-pixel regions, and the luminous layer is located on the anode conductive layer.

The electron injection layer is formed by using the ink-jet printer to inject a electron material into the sub-pixel regions, and the electron injection layer is located on the luminous layer.

The cathode conductive layer is located on the electron injection layer.

The hole material, the luminous material and the electron material are respectively injected into the sub-pixel region group by the ink-jet printing technology in this embodiment of the present configurations, so as to faith the hole injection layer, the luminous layer, and the electron injection layer respectively, and two of the sub-pixels are formed integrally. Compared with the prior art, the present configurations have increased an area for injection. It is convenient to inject the hole material, the luminous material, and the electron material into the sub-pixel region group, so as to improve the utilization of the pixel material and a thickness uniformity of the sub-pixels, and to reduce a possibility of producing the mura. Furthermore, it is convenient to apply the pixel structure to OLED display panels with a higher resolution.

Thus, each of the anode conductive layers and the cathode conductive layer in a single sub-pixel region group are connected, which controls a part of the sub-pixels contacted with the anode conductive layer to emit light. Another part of two anode conductive layers separated from each other in a single sub-pixel region group does not emit light.

It should be noted that two adjacent of the sub-pixel regions are defined as a single sub-pixel region group as an example used in the third embodiment of the present configurations. Two of the sub-pixel regions in a same sub-pixel region group may be in a same row or a same column.

For example, two green pixels are disposed in two sub-pixel regions in the same sub-pixel region group. Specifically, the hold material, a green luminous material, and the electron material are coated in the sub-pixel region group applied by the ink-jet printing technology, so as to form two green pixels formed integrally. More specifically, the hold material, the green luminous material, and the electron material are dropped into the sub-pixel region group by a nozzle of an ink-jet printer. The hold material, the green luminous material, and the electron material are formed into a plurality of integral structures in a single sub-pixel region group, respectively. In other words, two green pixels are formed integrally. Thus, the two green pixels are formed integrally in a same process.

It should be noted that a single sub-pixel region group is formed of four adjacent sub-pixel regions, which may also be achieved in the embodiment of the present configurations.

For example, four red pixels are disposed in four sub-pixel region in a same sub-pixel region group. Specifically, the hole material, a red luminous material, and the electron material are coated in the sub-pixel region group applied by the ink-jet printing technology, so as to form four red pixels formed integrally. More specifically, the hold material, the red luminous material, and the electron material are dropped into the sub-pixel region group by a nozzle of an ink-jet printer. The hold material, the red luminous material, and the electron material are formed into a plurality of integral structures in a single sub-pixel region group, respectively. In other words, four red pixels are formed integrally. Thus, the four red pixels are formed integrally in a same process.

Figure 9:
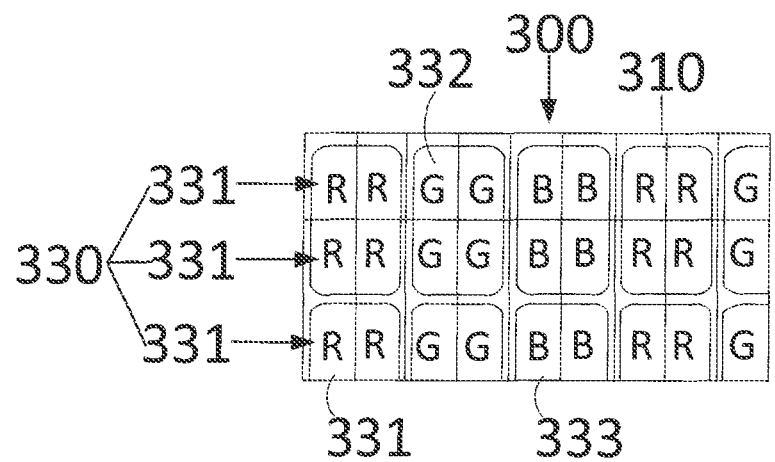
FIG. 9 is a structural diagram that illustrates a pixel structure in accordance with another embodiment of the present disclosure.
Figure 10:
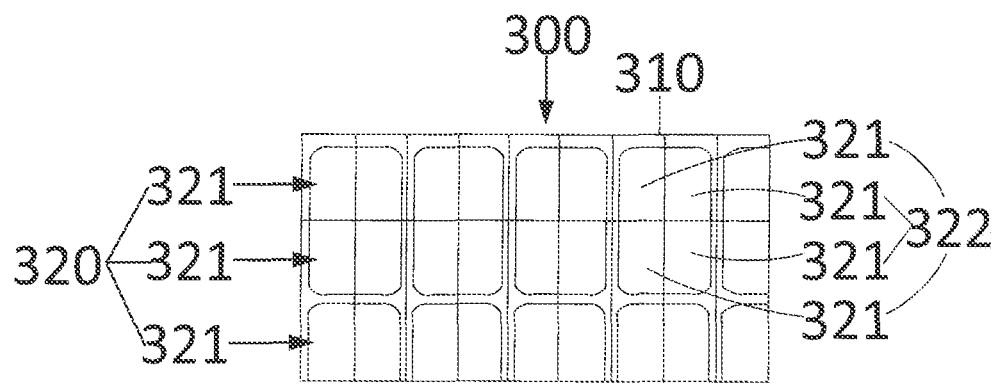
FIG. 10 is a structural diagram that illustrates a pixel region in accordance with another embodiment of the present disclosure.

It should be noted that the sub-pixel region group of the third embodiment of the present configurations may also have the other configurations, such as a single sub-pixel region group is formed of three adjacent sub-pixel region arranged in sequence in a same row, a single sub-pixel region group is formed of three adjacent sub-pixel region arranged in sequence in a same column, and a single sub-pixel region group comprises a half or one over two of four adjacent sub-pixel regions. As shown in FIGS. 9 and 10, the pixel structure 300 comprises a substrate 310, a pixel region 320, a plurality of pixel units 330, a plurality of anode conductive layers, and a cathode conductive layer. The third embodiment of the present configurations differs from the second embodiment in that a single sub-pixel region group 322 formed of a half of four adjacent sub-pixel regions, specifically four half sub-pixel regions 321. The red pixels 331, the green pixels 332 and the blue pixels 333 may be referred to the red pixels 131, green pixels 132, and blue pixels 133 in the first embodiment, as well as the red pixels 231, green pixels 232, and blue pixels 233 in the second embodiment. Further, the other structure and effect of the pixel structure 300 may refer to the first embodiment and the second embodiment respectively, it will not be repeated again here. Certainly, the sub-pixel region group may also comprise a plurality of four adjacent sub-pixel regions, wherein an area of a single sub-pixel region may be greater or lesser than a half of the whole area of the sub-pixel region group.

While the present configurations have been disclosed with reference to preferred embodiments, the above-described embodiments are not intended to limit the present configurations, and a person having ordinary skill in the art will be able to make various changes and modifications without departing from the spirit and scope of the present configurations, and thus the scope of the present configurations is defined by the scope of the claims.

What is claimed is:

1. A pixel structure of an organic light emitting diode (OLED) display panel, comprising:
   a pixel region comprising a plurality of sub-pixel regions arranged in sequence, wherein at least two adjacent sub-pixel regions define a sub-pixel region group, and wherein at least two sub-pixel regions are disposed integrally in the sub-pixel region group;

at least two anode conductive layers disposed in the sub-pixel regions respectively, the anode conductive layers in the sub-pixel region group separated from each other;

a plurality of pixel units, each of the pixel units comprising a plurality of sub-pixels and disposed in the pixel region, each of the sub-pixels disposed in one of the sub-pixel regions, the sub-pixels formed integrally and having a same color in the sub-pixel region group; and a cathode conductive layer electrically connected to the anode conductive layers to control the pixel units;

the sub-pixel region group comprising four half-sub-pixel regions, any one of the four half-sub-pixel regions adjacent to two of the four half-sub-pixel regions;

the pixel unit comprising:

a hole injection layer formed by injecting a hole material into the sub-pixel region group, the hole injection layer located on the anode conductive layer;

a luminous layer formed by injecting a luminous material into the sub-pixel region group, the luminous layer located on the hole injection layer; and an electron injection layer formed by injecting an electron material into the sub-pixel region group and located on the luminous layer; wherein the cathode conductive layer is located on the electron injection layer.

2. The pixel structure as claimed in claim 1, wherein an edge of the sub-pixel region group is made of a material being both hydrophobic and oleophobic.

3. The pixel structure as claimed in claim 2, wherein a profile of the sub-pixel region group is elliptical in shape.

4. The pixel structure as claimed in claim 1, wherein a profile of the sub-pixel region group is elliptical in shape.

5. The pixel structure as claimed in claim 1, further comprising at least two insulation layers, wherein the insulation layers surround edges of each of the anode conductive layers, and the insulation layers are located at adjacent positions on different anode conductive layers.

6. A pixel structure of an organic light emitting diode (OLED) display panel, comprising:

a pixel region, comprising a plurality of sub-pixel regions arranged in sequence, at least two adjacent sub-pixel regions defined as a sub-pixel region group, at least two sub-pixel regions disposed integrally in the sub-pixel region group;

at least two anode conductive layers, disposed in the sub-pixel regions respectively, the anode conductive layers in the sub-pixel region group separated from each other;

a plurality of pixel units, each pixel unit comprising a plurality of sub-pixels and disposed in the pixel region, each of the sub-pixels disposed in one of the sub-pixel regions, the sub-pixels formed integrally and having a same color in the sub-pixel region group; and a cathode conductive layer electrically connected to the anode conductive layers to control the pixel units;

each of the pixel units comprising:

a hole injection layer formed by injecting a hole material into the sub-pixel region group, the hole injection layer located on the anode conductive layer;

a luminous layer formed by injecting a luminous material into the sub-pixel region group, the luminous layer located on the hole injection layer; and an electron injection layer formed by injecting an electron material into the sub-pixel region group and located on the luminous layer; wherein the cathode conductive layer is located on the electron injection layer;

wherein the sub-pixel region group comprises four sub-pixel regions, any one of the four sub-pixel regions adjacent to two of the four sub-pixel regions.

7. The pixel structure as claimed in claim 6, wherein an edge of the sub-pixel region group is made of a material being both hydrophobic and oleophobic.

8. The pixel structure as claimed in claim 6, wherein a profile of the sub-pixel region group is elliptical in shape.

9. The pixel structure as claimed in claim 6, further comprising at least two insulation layers, wherein the insulation layers surround at an edge of each of the anode conductive layers, and the insulation layers are located at adjacent positions on different anode conductive layers.

10. A method for manufacturing a pixel structure of an organic light emitting diode (OLED), the method comprising:

forming at least two anode conductive layers on a substrate;

forming a pixel region on the substrate, the pixel region comprising a plurality of sub-pixel regions arranged in sequence, wherein at least two adjacent sub-pixel regions define a sub-pixel region group on the substrate, and wherein at least two sub-pixel regions are disposed integrally in the sub-pixel region group;

forming two of the at least two anode conductive layers in the sub-pixel region respectively, the anode conductive layers in the sub-pixel region group separated from each other;

forming a plurality of pixel units in the pixel region, each of the pixel units comprising a plurality of sub-pixels, forming a single of the sub-pixels in each of sub-pixel regions, at least two sub-pixels formed integrally and having a same color in the sub-pixel region group; and forming a cathode conductive layer on the substrate, the cathode conductive layer electrically connected with the anode conductive layers, to control the pixel units;

each of the pixel units comprising:

a hole injection layer formed by injecting a hole material into the sub-pixel region group, the hole injection layer located on the anode conductive layer;

a luminous layer formed by injecting a luminous material into the sub-pixel region group, the luminous layer located on the hole injection layer; and an electron injection layer formed by injecting an electron material into the sub-pixel region group, the electron injection layer located on the luminous layer; wherein the cathode conductive layer is located on the electron injection layer;

wherein the sub-pixel region group includes four half-sub-pixel regions, any one of the four half-sub-pixel regions adjacent to two of the four half-sub-pixel regions.

11. The method for manufacturing a pixel structure as claimed in claim 10, wherein the step of the pixel region formed on the substrate comprises: forming a hydrophobic oleophobic layer with a material being both hydrophobic and oleophobic on the substrate; and forming the pixel region on the hydrophobic oleophobic layer.

12. The method of manufacturing a pixel structure as claimed in claim 10, further comprising: forming at least two insulation layers on the substrate, wherein the insulation layers surround at an edge of each of the anode conductive layers, and the insulation layers are located at adjacent positions on different anode conductive layers.

13. The method for manufacturing a pixel structure as claimed in claim 10, wherein a profile of the sub-pixel region group is elliptical in shape.

* * * * *